(12) United States Patent
Hartman et al.

(10) Patent No.: US 10,651,233 B2
(45) Date of Patent: May 12, 2020

(54) METHOD FOR FORMING SUPERCONDUCTING STRUCTURES

(71) Applicants: Jeffrey David Hartman, Severn, MD (US); Justin C. Hackley, Catonsville, MD (US)

(72) Inventors: Jeffrey David Hartman, Severn, MD (US); Justin C. Hackley, Catonsville, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/107,321

(22) Filed: Aug. 21, 2018

(65) Prior Publication Data

US 2020/0066789 A1 Feb. 27, 2020

(51) Int. Cl.
*H01L 39/24* (2006.01)
*H01L 27/18* (2006.01)
*H01L 23/00* (2006.01)

(52) U.S. Cl.
CPC .............. *H01L 27/18* (2013.01); *H01L 24/13* (2013.01); *H01L 24/81* (2013.01); *H01L 39/24* (2013.01); *H01L 2224/0401* (2013.01); *H01L 2224/13109* (2013.01); *H01L 2224/13144* (2013.01); *H01L 2224/13166* (2013.01); *H01L 2224/13169* (2013.01); *H01L 2224/13171* (2013.01); *H01L 2224/16148* (2013.01)

(58) Field of Classification Search
None
See application file for complete search history.

(56) References Cited

U.S. PATENT DOCUMENTS 5,759,360 A * 6/1998 Ngan .................... B08B 7/0035
204/192.37
6,744,796 B1 * 6/2004 Chakrabarti ............ H01S 5/028
372/43.01

(Continued)

OTHER PUBLICATIONS

International Search Report for PCT/US2019/042394 dated Nov. 5, 2019.

*Primary Examiner* — Jay C Chang
(74) *Attorney, Agent, or Firm* — Tarolli, Sundheim, Covell & Tummino LLP

(57) ABSTRACT

A superconducting structure includes a first superconducting device having a plurality of first superconducting contact pads disposed on a top side of a first superconducting device, a second superconducting device having a plurality of second superconducting contact pads disposed on a bottom side of a second superconducting device, and a plurality of superconducting bump structures with a given bump structure coupling respective superconducting contact pads of the plurality of first superconducting contact pads and the second plurality of superconducting pads to one another to bond the first superconducting device to the second superconducting device. Each superconducting bump structure includes a first under bump metallization (UBM) layer disposed on the top surface of a given superconducting contact pad, a second UBM layer disposed on the top surface of a given superconducting contact pads, and a superconducting metal layer coupling the first UBM layer to the second UBM layer.

12 Claims, 5 Drawing Sheets

(56) References Cited

U.S. PATENT DOCUMENTS

| | | | |
|---|---|---|---|
| 2009/0081456 A1* | 3/2009 | Goyal | C30B 15/34 |
| | | | 428/389 |
| 2011/0079894 A1 | 4/2011 | Markunas et al. | |
| 2014/0246763 A1 | 9/2014 | Bunyk | |
| 2017/0373044 A1 | 12/2017 | Das et al. | |
| 2018/0013052 A1 | 1/2018 | Oliver et al. | |
| 2018/0366634 A1* | 12/2018 | Mutus | H01L 24/05 |

* cited by examiner

METHOD FOR FORMING SUPERCONDUCTING STRUCTURES

GOVERNMENT INTEREST

The invention was made under Government Contract Number 30059269. Therefore, the U.S. Government has rights to the invention as specified in that contract.

TECHNICAL FIELD

The present invention relates generally to superconductors, and more particularly to a methodology for forming superconducting structures.

BACKGROUND

Superconducting circuits are one of the leading technologies proposed for quantum computing and cryptography applications that are expected to provide significant enhancements to national security applications where communication signal integrity or computing power are needed. They are operated at temperatures <100 kelvin. Efforts on fabrication of superconducting devices have mostly been confined to university or government research labs, with little published on the mass producing of superconducting devices. Therefore, many of the methods used to fabricate superconducting devices in these laboratories utilize processes or equipment incapable of rapid, consistent fabrication. Recently there has been a movement to mass producing superconducting circuits utilizing similar techniques as those utilized in conventional semiconductor processes.

SUMMARY

In one example, a method is provided of forming a superconducting structure. The method comprises performing a first cleaning process on a top surface of a plurality of first superconducting contact pads disposed on a top side of a first superconducting device, depositing a first under bump metallization (UBM) layer on the top surface of each of the plurality of first superconducting contact pads, depositing a superconducting metal layer on each of the first UBM layers, and performing a second cleaning process on a top surface of each of the superconducting metal layers. The method further comprises performing a third cleaning process on a top surface of a plurality of second superconducting contact pads disposed on a bottom side of a second superconducting device, and depositing a second UBM layer on the top surface of each of the plurality of second superconducting contact pads. A bonding process is then performed to connect the first superconducting device and the second superconducting device by coupling the superconducting metal layers of the first superconducting device to respective second UBM layers of the second superconducting device.

In another example, a method is provided of forming a superconducting structure. The method comprises performing a first cleaning process on a top surface of a plurality of first superconducting contact pads disposed on a top side of a first superconducting device, depositing a first under bump metallization (UBM) comprised of, but not limited to gold, titanium, chromium, platinum, or a combination thereof having a thickness between about 10 Å to about 1000 Å, to provide similar properties as a superconductor, on the top surface of each of the plurality of first superconducting contact pads, depositing a superconducting metal layer on each of the first UBM layers, and performing a second cleaning process on a top surface of each of the superconducting metal layers. The method further comprises performing a third cleaning process on a top surface of a plurality of second superconducting contact pads disposed on a bottom side of a second superconducting device, depositing a second UBM comprised of, but not limited to gold, titanium, chromium, platinum, or a combination thereof having a thickness between about 10 Å to about 1000 Å, to provide similar properties as a superconductor, on the top surface of each of the plurality of second superconducting contact pads, and performing a fourth cleaning process on a top surface of each of the second UBM layers. A bonding process is then performed to connect the first superconducting device and the second superconducting device by coupling the superconducting metal layers of the first superconducting device to respective second UBM layers of the second superconducting device.

In yet another example, a superconducting structure is provided that comprises a first superconducting device having a plurality of first superconducting contact pads disposed on a top side of a first superconducting device, a second superconducting device having a plurality of second superconducting contact pads disposed on a bottom side of a second superconducting device, and a plurality of superconducting bump structures with a given superconducting bump structure coupling respective superconducting contact pads of the plurality of first superconducting contact pads and the second plurality of superconducting pads to one another to bond the first superconducting device to the second superconducting device. Each of the plurality of superconducting bump structures comprising a first under bump metallization (UBM) layer disposed on the top surface of a given one of the plurality of first superconducting contact pads, a second UBM layer disposed on the top surface of a given one of the plurality of second superconducting contact pads, and a superconducting metal layer coupling the first UBM layer to the second UBM layer.

DETAILED DESCRIPTION

The disclosure relates to the forming of superconducting structures from two or more superconducting devices. The two or more superconducting devices can be electrically and mechanically coupled to one another via bump bond structures. The bump bond structures are formed from a bump bonding process that achieves a superconducting interconnect between superconducting devices, such as for flip chip integration. In particular, a fabrication process is described herein to generate a superconducting bump structure that is substantially oxide free for subsequent flip chip integration. This disclosure addresses limitations of systems that use thick, normal metals for under bump metallization (UBM), which results in a non-superconducting bump structure. In particular, metalized contacts can degrade due to oxides and contaminated surfaces, which can be of particular concern for superconducting applications. The processes described herein demonstrate an improved superconducting bump structure substantially free of surface oxides.

In order to achieve a superconducting bump for subsequent flip chip integration, all residual oxides and contamination are eliminated at each interface. To accomplish this, additional cleaning steps prior to bonding remove residue (e.g. hydrocarbons), eliminate contaminated, oxidized interfaces, and provide a clean bonding environment for each superconducting contact. The process can passivate contact pads underneath the bumps to prevent oxidation from ambient exposure prior to bump metal deposition. In addition, the process provides a UBM stack formed from a single UBM layer with a normal metal that has a thickness that is selected to exhibit similar superconducting properties as a superconducting metal layer. Thus, the process described herein is an improvement over a conventional bump bonding processes that uses a UBM metal stack with multiple layers and a thickness greater than 2000 Å, and ignores the presence of interfacial oxides or uses flux to aid in the removal of the oxides. Thick UBM stacks, interfacial oxides, flux, and residues inhibit superconducting contacts.

Figure 1:
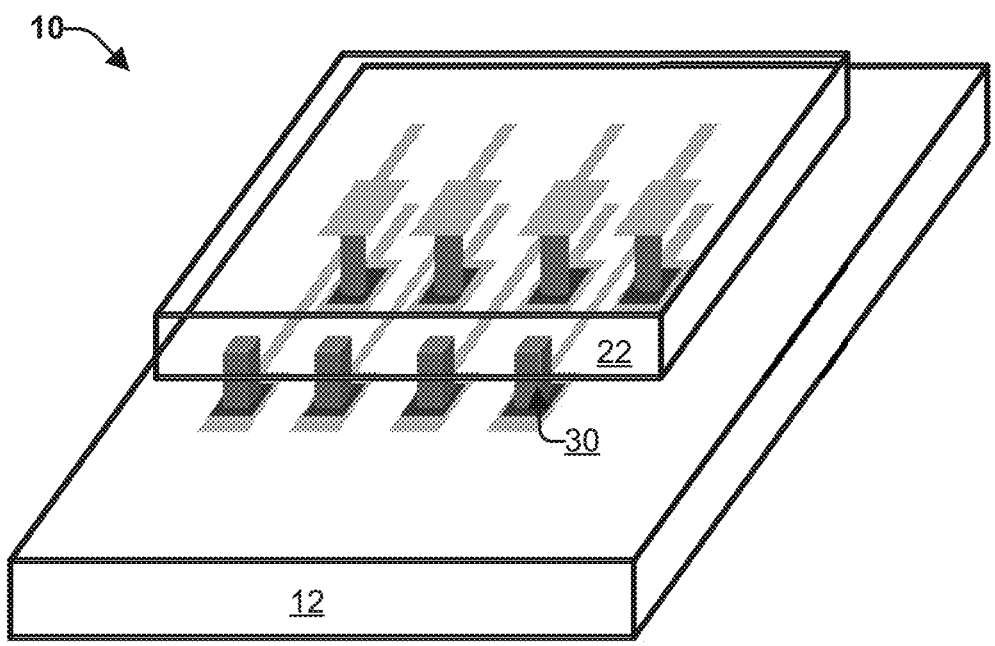
FIG. 1 illustrates a perspective view of a Chip-on-Chip superconducting structure.
Figure 2:
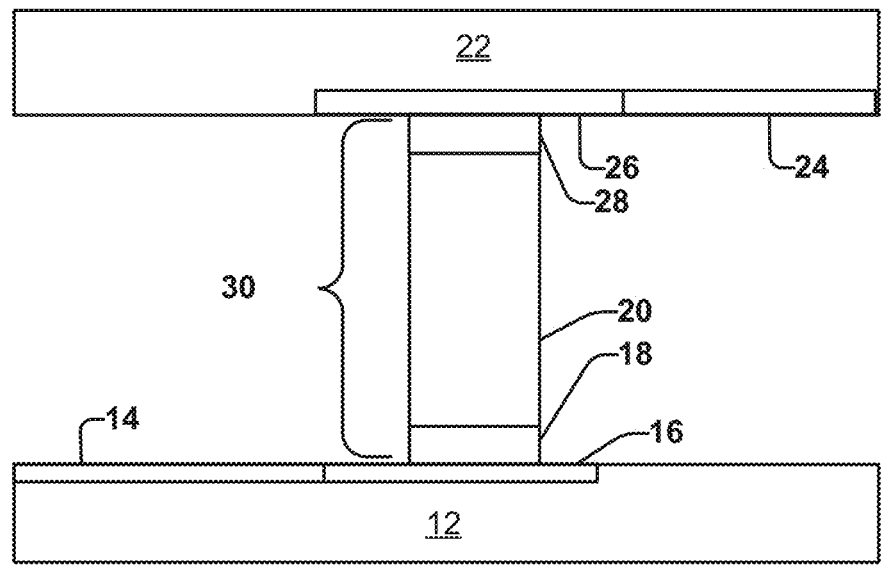
FIG. 2 illustrates a schematic cross-sectional view of a superconductor bump structure.

FIG. 1 illustrates a perspective view of an example of a Chip-on-Chip superconducting structure 10. FIG. 2 illustrates a schematic cross-sectional view of an example superconducting bump structure 30 of the superconducting structure 10. The Chip-on-Chip superconducting structure 10 includes a first superconducting device 12 (e.g., bottom device or main device) connected to a second superconducting device 22 (e.g., top device or auxiliary device), through a plurality of superconductor bumps structures 30. A superconducting structure could include multiple superconducting devices connected to another superconducting device. A superconducting device can be a substrate wafer, a package device for passing signals to another device, an integrated circuit (IC), or a variety of other types of superconducting devices.

The first superconducting device 12 includes a plurality of first superconducting contact pads 16 disposed on a top side of the first superconducting device 12. The plurality of first superconducting contact pads 16 are coupled to conductive lines 14 that electrically couple the plurality of first superconducting contact pads 16 to other electrical elements such as vias and/or circuitry within the first superconducting device 12. The second superconducting device 22 includes a plurality of second superconducting contact pads 26 disposed on a bottom side of the second superconducting device 22. The plurality of second superconducting contact pads 26 are coupled to conductive lines 24 that electrically couple the plurality of second superconducting contact pads 26 to other electrical elements such as vias and/or circuitry within the second superconducting device 22. The first superconducting device 12 is electrically and mechanically coupled to the second superconducting device 22 by a plurality of superconducting bump structures 30 that bond the devices to one another through corresponding superconducting contact pads of the first and second superconducting structures 12 and 22, respectively.

Referring to FIG. 2, the superconducting bump structure 30 is formed of a first UBM layer 18 that overlies a given first superconducting contact pad of the plurality of first superconducting contact pads 16, a second UBM layer 28 that overlies a given second superconducting contact pad of the plurality of second superconducting contact pads 26, and a superconducting metal layer 20 that couples the first UBM layer 18 to the second UBM layer 28. The first UBM layer 18 and the second UBM layer 28 promote adhesion and/or act as a barrier layer to prevent the formation of native oxide which naturally occur for most metals, and can be formed from a metal including, but not limited to gold, titanium, chromium, platinum, or a combination thereof. Employing a UBM metal layer having a thickness of between about 10 Å to about 1000 Å provides for a normal metal layer that can exhibit similar superconducting properties as a superconducting metal layer. The superconducting metal layer 20 can be formed of Indium or some other superconducting metal having a thickness of about 0.5 micrometers to about 50 micrometers.

Turning now to FIGS. 3-14, fabrication is discussed in connection with formation of a superconducting structure similar to that illustrated in FIGS. 1-2. It is to be appreciated that the present example is discussed with respect to a process flow of forming bump structures to bond two superconducting devices to one another. The process flow starts with the providing of a first superconducting device (e.g., a wafer having a number of first ICs, a first IC) with a top side of superconducting contact pads and with the providing of a second superconducting device (e.g., second IC) with a bottom side of superconducting contact pads. The present example will be further illustrated with respect to the deposition of a UBM metal layer on the superconducting contact pads sized to mitigate oxidization of the contact pads, while still retaining the superconductivity of contacts for passing signals through the superconducting contact pads. The present example will be illustrated with respect to the superconducting contact pads of the top and bottom sides of the superconducting devices undergoing a cleaning process(es) prior to bonding to remove excess photoresist residue, eliminate contaminated and oxidized interfaces, and provide a clean bonding environment for each superconducting contact pad.

Figure 3:
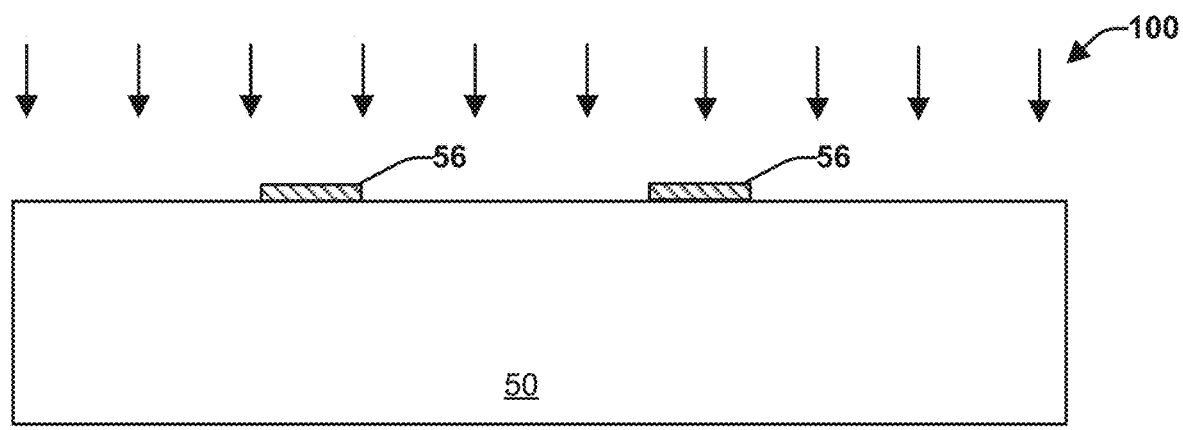
FIG. 3 illustrates a schematic cross-sectional view of an example of a first superconducting device and while undergoing a plasma cleaning process.

FIG. 3 illustrates a cross-sectional view of a first superconducting device 50 (e.g., a first IC or a first substrate wafer) of the superconducting structure in its early stages of fabrication. The first superconducting device 50 can include conventional and/or superconducting circuitry for executing a number of circuit functions, or pass through vias for connecting to other superconducting devices. Portions of the circuitry or vias can be connected to a plurality of first superconducting contact pads 56, via one or more conductive lines (not shown), for sharing functionality and/or signals with a second superconducting device. The plurality of first superconducting contact pads 56 can be formed of a superconducting metal, including but not limited to niobium or aluminum. The first superconducting device 50 can be a first substrate wafer having a plurality of first ICs to be cut from the first substrate wafer into individual first ICs, or the first superconducting device 50 can be a first IC. For illustrate purposes, the description will refer to a first superconducting device 50 as opposed to a first IC or a first substrate wafer.

FIG. 3 also illustrates performing a plasma cleaning process 100 on the top side of the first superconducting device 50 to remove residue (e.g., hydrocarbons) from a top surface of the plurality of first superconducting contact pads 56. The first superconducting device 50 can reside in a chamber for performing the plasma cleaning process 100, which can be an oxygen ($O_2$) based plasma process. In the oxygen based plasma process, oxygen is used to oxidize residue to form by-products which may be removed using a vacuum pump.

Figure 4:
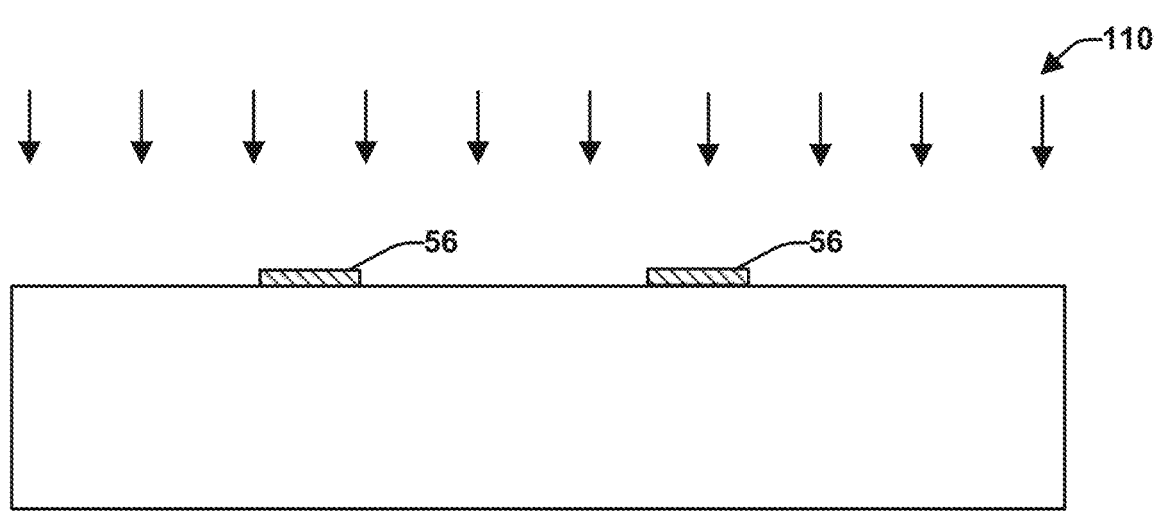
FIG. 4 illustrates a schematic cross-sectional view of the first superconducting device of FIG. 3 while undergoing an etch process.

Next, as illustrated in FIG. 4, an etch process 110 is performed on the top side of the first superconducting device 50 and the plurality of first superconducting contact pads 56 to remove oxides from the plurality of first superconducting contact pads 56 mainly due to the plasma and the environment. The etch process 110 can be a wet etch such as a hydrofluoric (HF) acid etch. The HF etch is followed by a deionized water (DI) rinse. A spin/rinse/dry process can follow.

Figure 5:
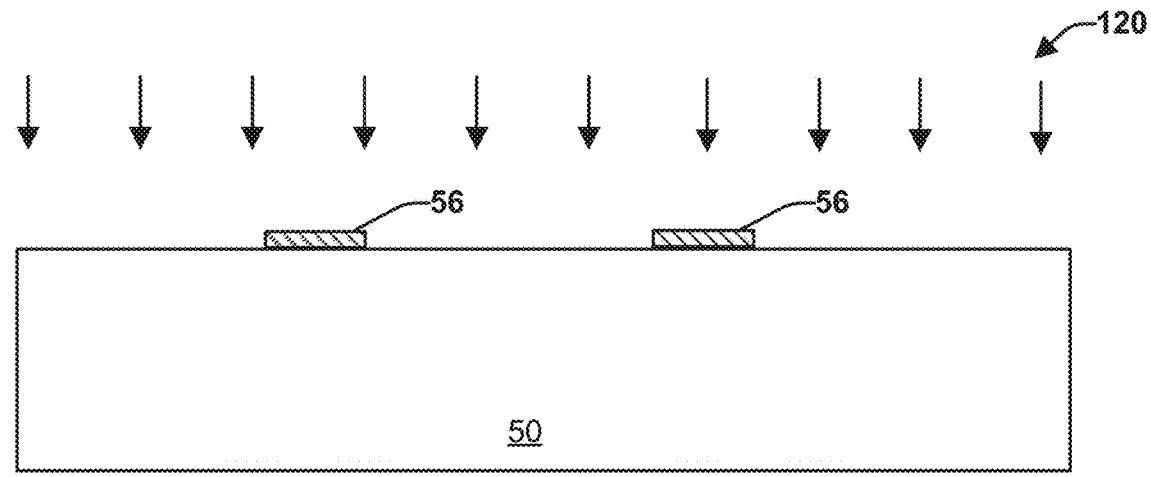
FIG. 5 illustrates a schematic cross-sectional view of the first superconducting device of FIG. 4 while undergoing another etch process.

Next, referring to FIG. 5, an etch process 120 is performed on the top side of the first superconducting device 50 and the plurality of first superconducting contact pads 56. The etch process 120 can be an argon sputter dry etch or ion mill to clean in-situ the top surface of the plurality of first superconducting contact pads 56. Alternatively, the etch process 120 can be a vapor phase etch, e.g. Xenon DiFluoride ($XeF_2$), to remove any residual native oxide and to fluorine passivate the top surface of the plurality of first superconducting contact pads 56.

Figure 6:
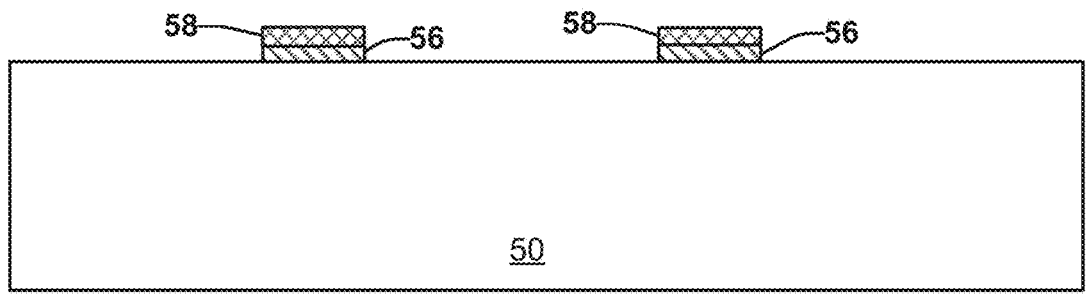
FIG. 6 illustrates a schematic cross-sectional view of the first superconducting device of FIG. 5 after a material deposition to form first under bump metallization (UBM) layers.

The top side of the first superconducting device 50 then undergoes a contact material fill to deposit a first UBM layer 58 onto each of plurality of first superconducting contact pads 56 to form the resultant structure as illustrated in FIG. 6. The first UBM layer 58 can be a metal layer that has a thickness of about 10 Å to about 1000 Å and promotes adhesion and/or act as a barrier to prevent the formation of native oxide which naturally occur for most metals. Additionally, the first UBM layer 58 can be formed from a metal including, but not limited to gold, titanium, chromium, platinum, or a combination thereof. The thickness of the first UBM layer 58 can be selected such that the first UBM layer 58 can have superconducting properties similar to the plurality of first superconducting contact pads 56. The first UBM layer 58 can be deposited employing a standard contact material deposition such as evaporation, or sputtering.

Figure 7:
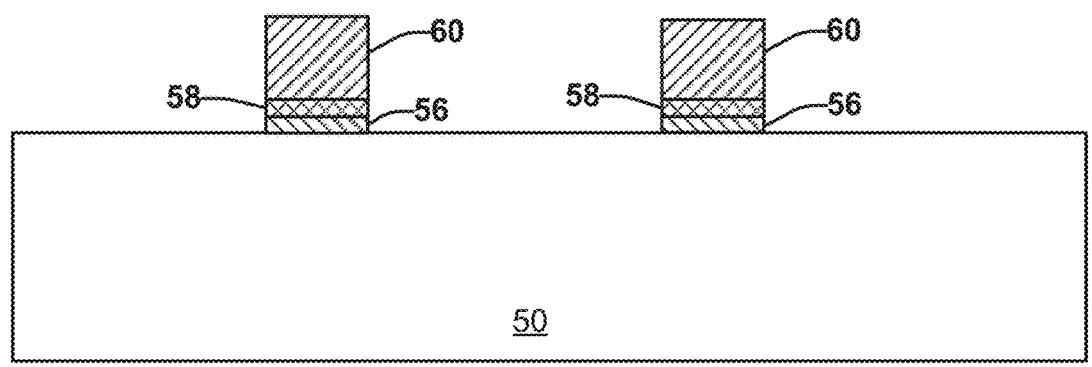
FIG. 7 illustrates a schematic cross-sectional view of the first superconducting device of FIG. 6 after a material deposition to form superconducting metal layers.

Next, as illustrated in FIG. 7, a superconducting metal layer 60 is deposited over the first UBM layer 58. The superconducting metal layer 60 can be deposited employing a standard contact material deposition such as evaporation and can be a superconducting metal such as, for example, Indium having a thickness of about 0.5 micrometers to about 50 micrometers. The superconducting metal layer 60 can be deposited in-situ in the same deposition chamber as the first UBM layer 58. In the example where processes of FIG. 3-7 are to be performed on a substrate wafer, the substrate wafer is then cut into a plurality of first ICs.

Figure 8:
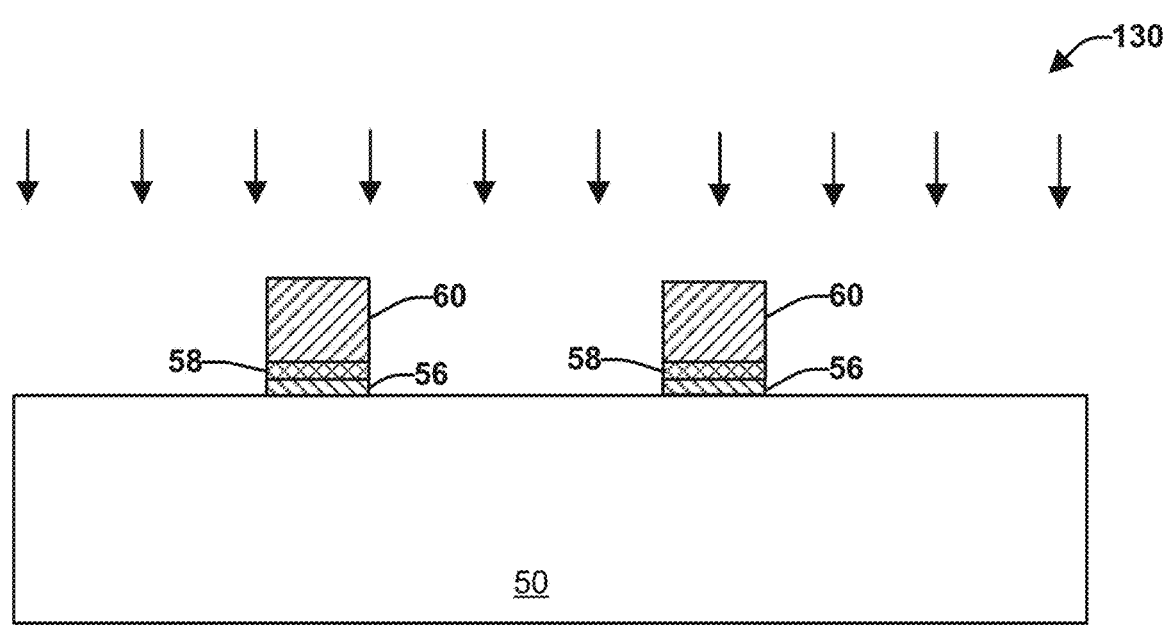
FIG. 8 illustrates a schematic cross-sectional view of the first superconducting device of FIG. 7 while undergoing yet another etch process.

The first superconducting device 50 then undergoes an etch process 130 on the top side of the first superconducting device 50 to remove any oxides formed on the superconducting metal layer 60, as illustrated in FIG. 8. The etch process 130 can be a hydrochloric (HCl) acid etch or a formic acid etch immediately prior to bonding with another superconducting device. Alternatively, the etch process 130 can be a $XeF_2$ etch to remove any residual native oxide on the superconducting metal layer 60 and to passivate the top surface of the superconducting metal layer 60. Subsequently, the first superconducting device 50 is ready for bonding to a second superconducting device.

Figure 9:
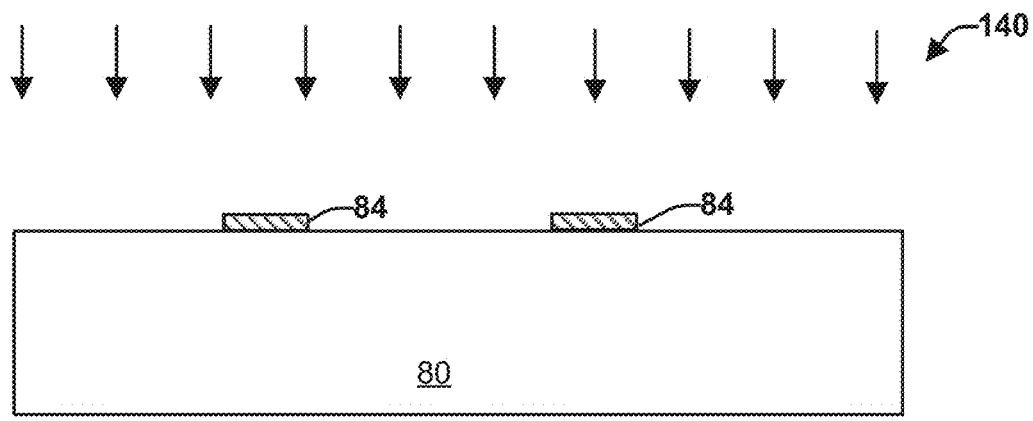
FIG. 9 illustrates a schematic cross-sectional view of an example of a second superconducting device and while undergoing a plasma cleaning process.

FIG. 9 illustrates a cross-sectional view of a second superconducting device 80 in its early stages of fabrication. The second superconducting device 80 can include conventional and/or superconducting circuitry for executing a number of circuit functions, and/or superconducting vias for passing signals to other devices. Portions of the circuitry can be connected to a plurality of second superconducting contact pads 84, via one or more conductive lines (not shown), for sharing functionality and/or signals with one or more other ICs. The plurality of second superconducting contact pads 84 can be formed of a superconducting metal, such as niobium or aluminum. The second superconducting device 80 can be a second substrate wafer that can include a plurality of second ICs to be cut from the second substrate wafer into individual second ICs, or a second IC.

FIG. 9 also illustrates performing a plasma cleaning process 140 on a bottom side of the second superconducting device 80 to remove residue (e.g., hydrocarbons) from a top surface of the plurality of second superconducting contact pads 84. The second superconducting device 80 can reside in a chamber for performing the plasma cleaning process 140, which can be an oxygen ($O_2$) based plasma process. In the oxygen based plasma process, oxygen is used to oxidize residue which may be removed using a vacuum pump.

Figure 10:
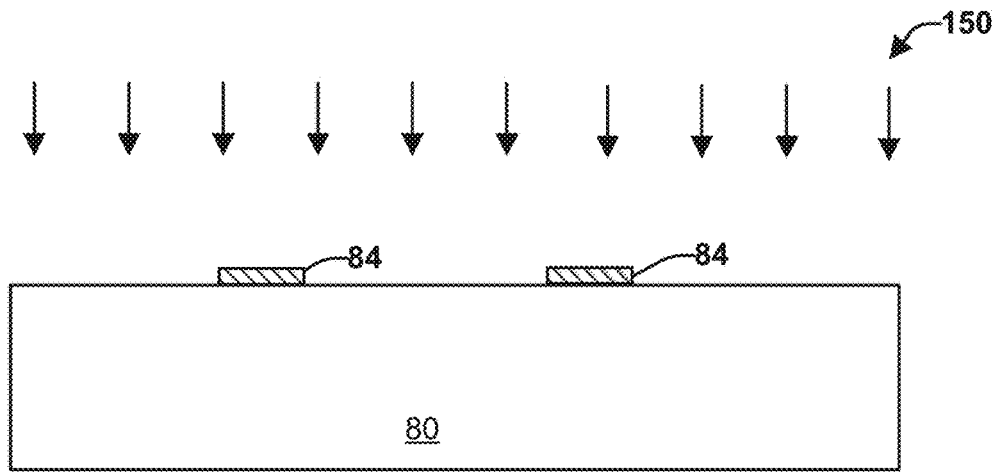
FIG. 10 illustrates a schematic cross-sectional view of the second superconducting device of FIG. 9 while undergoing an etch process.

Next, as illustrated in FIG. 10, an etch process 150 is performed on the bottom side of the second superconducting device 80 and the plurality of second superconducting contact pads 84 to remove oxides from the plurality of second superconducting contact pads 84 mainly due to the plasma process and the environment. The wet etch process 150 can be a wet etch such as a hydrofluoric (HF) acid etch. The HF etch is followed by a deionized water (DI) rinse. A spin/rinse/dry process can follow.

Figure 11:
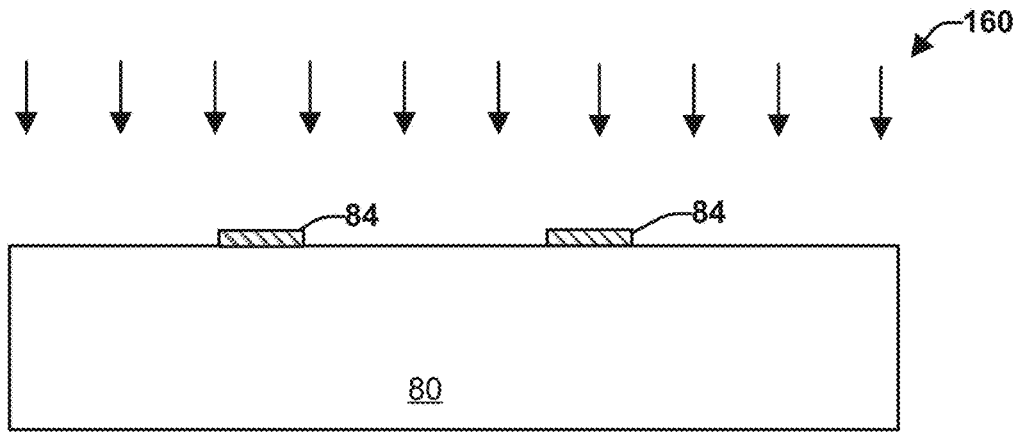
FIG. 11 illustrates a schematic cross-sectional view of the second superconducting device of FIG. 10 while undergoing another etch process.

Next, referring to FIG. 11, an etch process 160 is performed on the bottom side of the second superconducting device 80 and the plurality of second superconducting contact pads 84. The etch process 120 can be an argon sputter dry etch or ion mill to clean in-situ the top surface of the plurality of second superconducting contact pads 84.

Figure 12:
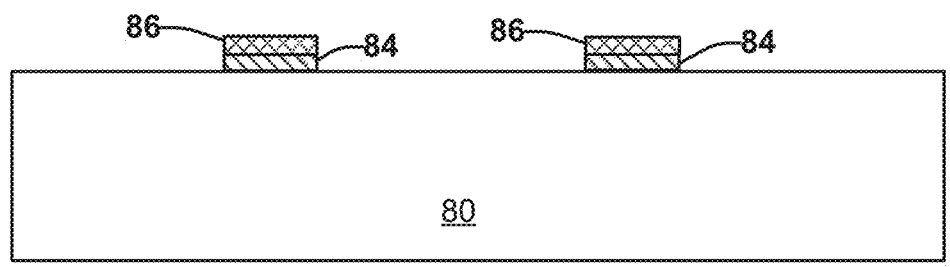
FIG. 12 illustrates a schematic cross-sectional view of the first superconducting device of FIG. 11 after a material deposition to form second UBM layers.

The bottom side of the second superconducting device 80 then undergoes a contact material fill to deposit a second UBM layer 86 onto each of plurality of second superconducting contact pads 84 to form the resultant structure as illustrated in FIG. 12. The second UBM layer 86 can be a metal that has a thickness of about 10 Å to about 1000 Å and promotes adhesion and/or act as a barrier to prevent the formation of native oxide which naturally occur for most metals. Additionally, the second UBM layer 86 can be formed from a metal including, but not limited to gold, titanium, chromium, platinum, or a combination thereof. The thickness of the second UBM layer 86 can be selected such that the second UBM layer 86 can have superconducting properties similar to the plurality of second superconducting contact pads 84. The second UBM layer 86 can be deposited employing a standard contact material deposition such as evaporation, or sputtering.

Figure 13:
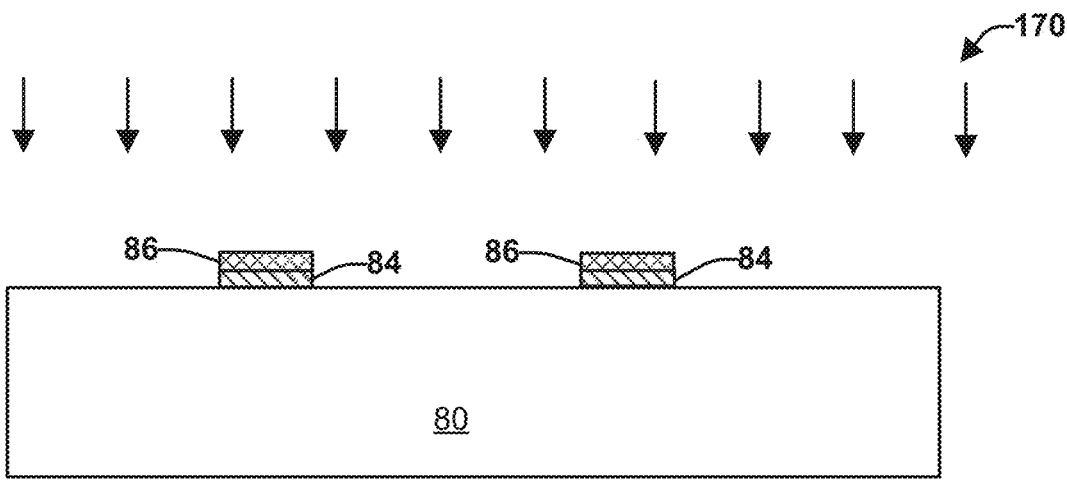
FIG. 13 illustrates a schematic cross-sectional view of the second superconducting device of FIG. 12 while undergoing yet another etch process.

Next, as illustrated in FIG. 13, a second plasma cleaning process 170 is performed on the bottom side of the second superconducting device 80 to remove any native oxide from the top surface of the second UBM layers 86 immediately prior to bonding with the top side of the first superconducting device 50. The second plasma cleaning process 170 can be an oxygen based plasma process) followed by an argon based plasma process) to remove oxides from the oxygen based plasma process.

Figure 14:
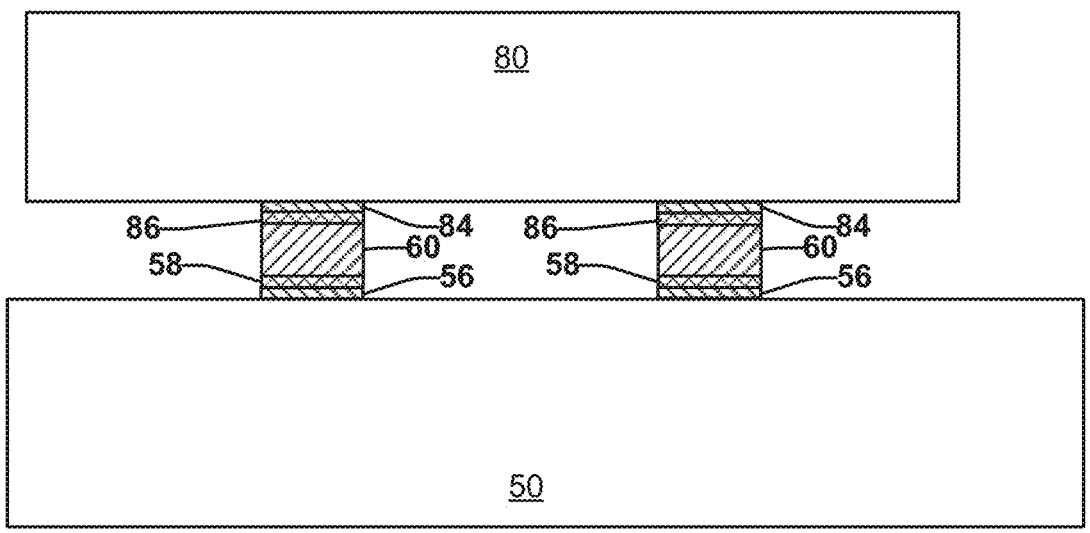
FIG. 14 illustrates a schematic cross-sectional view of the final structure after undergoing a flip chip bonding process of the first superconducting device and the second superconducting device.

A bonding process is performed to bond the top portion of the superconducting structure 50 to the bottom side of the superconducting structure 80 immediately after performing the etch process 130 and the second plasma cleaning process 170 to provide the structure of FIG. 14. The bonding process can be a flip chip process that bonds the superconducting metal layer 60 to the second UBM layer 86 via one of a variety of different flip chip bonding techniques.

For purposes of simplification of explanation the terms "overlay", "overlaying", "underlay" and "underlying" (and derivatives) are employed throughout this disclosure to denote a relative position of two adjacent surfaces in a selected orientation. Additionally, the terms "top" and "bottom" employed throughout this disclosure denote opposing surfaces in the selected orientation. Similarly, the terms "upper" and "lower" denote relative positions in the selected orientation are for purposes of illustration. In fact, the examples used throughout this disclosure denote one selected orientation. In the described examples, however, the selected orientation is arbitrary and other orientations are possible (e.g., upside down, rotated by 90 degrees, etc.) within the scope of the present disclosure.

Described above are examples of the subject disclosure. It is, of course, not possible to describe every conceivable combination of components or methodologies for purposes of describing the subject disclosure, but one of ordinary skill in the art may recognize that many further combinations and permutations of the subject disclosure are possible. Accordingly, the subject disclosure is intended to embrace all such alterations, modifications and variations that fall within the spirit and scope of the appended claims. In addition, where the disclosure or claims recite "a," "an," "a first," or "another" element, or the equivalent thereof, it should be interpreted to include one or more than one such element, neither requiring nor excluding two or more such elements. Furthermore, to the extent that the term "includes" is used in either the detailed description or the claims, such term is intended to be inclusive in a manner similar to the term "comprising" as "comprising" is interpreted when employed as a transitional word in a claim. Finally, the term "based on" is interpreted to mean at least based in part.

What is claimed is:

1. A method of forming a superconducting structure, the method comprising:
   performing a first cleaning process on a top surface of a plurality of first superconducting contact pads disposed on a top side of a first superconducting device, the first cleaning process comprising an oxygen based plasma process to remove contamination, a hydrofluoric (HF) acid etch to remove oxides, and an argon based sputter process to clean the top surfaces of the plurality of first superconducting contact pads;
   depositing a first under bump metallization (UBM) layer on the top surface of each of the plurality of first superconducting contact pads;
   depositing a superconducting metal layer on each of the first UBM layers;
   performing a second cleaning process on a top surface of each of the superconducting metal layers;
   performing a third cleaning process on a top surface of a plurality of second superconducting contact pads disposed on a bottom side of a second superconducting device, the third cleaning process comprising another oxygen based plasma process to remove contamination, another hydrofluoric (HF) acid etch to remove oxides, and another argon based sputter process to clean the top surfaces of the plurality of second superconducting contact pads;
   depositing a second UBM layer on the top surface of each of the plurality of second superconducting contact pads; and
   performing a bonding process to connect the first superconducting device and the second superconducting device by coupling the superconducting metal layers of the first superconducting device to respective second UBM layers of the second superconducting device.

2. The method of claim 1, wherein the first and second UBM layers have a thickness between 10 Å to 1000 Å to promote adhesion and to provide similar properties as a superconductor.

3. The method of claim 1, wherein the first and second UBM layers are formed from one of gold, titanium, chromium, platinum or a combination thereof.

4. The method of claim 1, wherein the superconducting metal layer is formed from indium.

5. The method of claim 1, wherein the second cleaning process is one of a hydrochloric (HCl) acid etch, a formic acid etch, or a xenon difluoride ($XeF_2$) etch to remove oxides on the top surface of the superconducting metal layer.

6. The method of claim 1, further comprising performing a fourth cleaning process on a top surface of each of the second UBM layers.

7. The method of claim 6, wherein the fourth cleaning process is an oxygen and argon based plasma process to clean the top surface of each of the second UBM layers.

8. The method of claim 7, wherein the fourth cleaning process is an oxygen and argon based plasma process to clean the top surface of each of the second UBM layers.

9. A method of forming a superconducting structure, the method comprising:
   performing a first cleaning process on a top surface of a plurality of first superconducting contact pads disposed on a top side of a first superconducting device, the first cleaning process comprising an oxygen based plasma process to remove contamination, a hydrofluoric (HF) acid etch to remove oxides, and an argon based sputter process to clean the top surfaces of the plurality of first superconducting contact pads;

depositing a first under bump metallization (UBM) layer of gold having a thickness between 10 Å to 1000 Å, to provide similar properties as a superconductor, on the top surface of each of the plurality of first superconducting contact pads;

depositing a superconducting metal layer on each of the first UBM layers;

performing a second cleaning process on a top surface of each of the superconducting metal layers, the third cleaning process comprising another oxygen based plasma process to remove contamination, another hydrofluoric (HF) acid etch to remove oxides, and another argon based sputter process to clean the top surfaces of the plurality of second superconducting contact pads;

performing a third cleaning process on a top surface of a plurality of second superconducting contact pads disposed on a bottom side of a second superconducting device;

depositing a second UBM layer of gold having a thickness between 10 Å to 1000 Å, to provide similar properties as a superconductor, on the top surface of each of the plurality of second superconducting contact pads;

performing a fourth cleaning process on a top surface of each of the second UBM layers; and performing a bonding process to connect the first superconducting device and the second superconducting device by coupling the superconducting metal layers of the first superconducting device to respective second UBM layers of the second superconducting device.

10. The method of claim 9, wherein the superconducting metal layer is formed from indium or indium containing alloys.

11. The method of claim 9, wherein the second cleaning process is one of a hydrochloric (HCl) acid etch, a formic acid etch, or a xenon difluoride ($XeF_2$) etch to remove oxides on the top surface of the superconducting metal layer.

12. The method of claim 9, wherein the bonding process is a flip chip process.

* * * * *